(12) United States Patent  
Bosley et al.

(10) Patent No.: US 7,689,182 B1
(45) Date of Patent: Mar. 30, 2010

(54) TEMPERATURE COMPENSATED BIAS FOR AM/PM IMPROVEMENT

(75) Inventors: Ryan Bosley, Greensboro, NC (US); Jackie Johnson, Trinity, NC (US); Frank Tamborino, Summerfield, NC (US); Michael F. Zybura, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 613 days.

(21) Appl. No.: 11/548,876

(22) Filed: Oct. 12, 2006

(51) Int. Cl.
H04B 1/04 (2006.01)

(52) U.S. Cl. .................. 455/127.1; 455/126; 455/91; 455/127.3

(58) Field of Classification Search .................. 455/126, 455/127.1–127.5, 91, 102–108
See application file for complete search history.

(56) References Cited

U.S. PATENT DOCUMENTS

| | | |
|---|---|---|
| 3,900,823 A | 8/1975 | Sokal et al. |
| 4,609,881 A | 9/1986 | Wells |
| 4,837,786 A | 6/1989 | Gurantz et al. |
| 5,055,802 A | 10/1991 | Hietala et al. |
| 5,079,522 A | 1/1992 | Owen et al. |
| 5,313,411 A | 5/1994 | Tsujimoto |
| 5,430,416 A | 7/1995 | Black et al. |
| 5,444,415 A | 8/1995 | Dent et al. |
| 5,598,436 A | 1/1997 | Brajal et al. |
| 5,608,353 A | 3/1997 | Pratt |
| 5,629,648 A | 5/1997 | Pratt |
| 5,822,011 A | 10/1998 | Rumreich |
| 5,900,778 A | 5/1999 | Stonick et al. |
| 5,952,895 A | 9/1999 | McCune, Jr. et al. |
| 6,008,703 A | 12/1999 | Perrott et al. |
| 6,101,224 A | 8/2000 | Lindoff et al. |
| 6,130,579 A | 10/2000 | Iyer et al. |
| 6,141,390 A | 10/2000 | Cova |
| 6,191,656 B1 | 2/2001 | Nadler |
| 6,211,747 B1 | 4/2001 | Trichet et al. |
| 6,229,395 B1 | 5/2001 | Kay |
| 6,236,687 B1 | 5/2001 | Caso et al. |
| 6,236,703 B1 | 5/2001 | Riley |
| 6,236,837 B1 | 5/2001 | Midya |
| 6,240,278 B1 | 5/2001 | Midya et al. |
| 6,246,286 B1 | 6/2001 | Persson |
| 6,271,727 B1 | 8/2001 | Schmukler |
| 6,275,685 B1 | 8/2001 | Wessel et al. |
| 6,285,239 B1 | 9/2001 | Iyer et al. |
| 6,288,610 B1 | 9/2001 | Miyashita |

(Continued)

OTHER PUBLICATIONS

Andraka, Ray, "A Survey of CORDIC Algorithms for FPGA Based Computers," Association for Computing Machinery, 0-89791-978-5, 1998.

(Continued)

*Primary Examiner*—Lana N Le
(74) *Attorney, Agent, or Firm*—Withrow & Terranova, P.L.L.C.

(57) ABSTRACT

A system and method are provided for maintaining a consistent operating condition of a power amplifier power amplifier across a range of operating temperatures. The power amplifier is provided with an input bias voltage (Vbias) that adjusts with temperature to compensate for the temperature dependent change of the power amplifier's base-emitter voltage drop Vbe. This maintains a consistent operating condition in the power amplifier, which reduces temperature-dependent changes in the amplifier's gain.

13 Claims, 4 Drawing Sheets

U.S. PATENT DOCUMENTS

| | | |
|---|---|---|
| 6,295,442 B1 | 9/2001 | Camp, Jr. et al. |
| RE37,407 E | 10/2001 | Eisenberg et al. |
| 6,307,364 B1 | 10/2001 | Augustine |
| 6,329,809 B1 | 12/2001 | Dening et al. |
| 6,335,767 B1 | 1/2002 | Twitchell et al. |
| 6,356,150 B1 | 3/2002 | Spears et al. |
| 6,359,950 B2 | 3/2002 | Gossmann et al. |
| 6,366,177 B1 | 4/2002 | McCune et al. |
| 6,377,784 B2 | 4/2002 | McCune |
| 6,392,487 B1 | 5/2002 | Alexanian |
| 6,417,731 B1 | 7/2002 | Funada et al. |
| 6,489,846 B2 | 12/2002 | Hatsugai |
| 6,504,885 B1 | 1/2003 | Chen |
| 6,522,121 B2 | 2/2003 | Coumou |
| 6,581,082 B1 | 6/2003 | Opsahl |
| 6,587,514 B1 | 7/2003 | Wright et al. |
| 6,642,786 B1 | 11/2003 | Jin et al. |
| 6,693,468 B2 | 2/2004 | Humphreys et al. |
| 6,700,929 B1 | 3/2004 | Shan et al. |
| 6,701,134 B1 | 3/2004 | Epperson |
| 6,701,138 B2 | 3/2004 | Epperson et al. |
| 6,720,831 B2 | 4/2004 | Dening et al. |
| 6,724,252 B2 | 4/2004 | Ngo et al. |
| 6,724,265 B2 | 4/2004 | Humphreys |
| 6,724,831 B1 | 4/2004 | Hasegawa et al. |
| 6,728,324 B1 | 4/2004 | Shan et al. |
| 6,731,145 B1 | 5/2004 | Humphreys et al. |
| 6,748,204 B1 | 6/2004 | Razavi et al. |
| 6,782,244 B2 | 8/2004 | Steel et al. |
| 6,798,843 B1 | 9/2004 | Wright et al. |
| 6,801,086 B1 | 10/2004 | Chandrasekaran |
| 6,807,406 B1 | 10/2004 | Razavi et al. |
| 6,816,718 B2 | 11/2004 | Yan et al. |
| 6,819,914 B1 | 11/2004 | Yan et al. |
| 6,819,941 B2 | 11/2004 | Dening et al. |
| 6,831,506 B1 | 12/2004 | Moffatt et al. |
| 6,834,084 B2 | 12/2004 | Hietala |
| 6,836,517 B2 | 12/2004 | Nagatani et al. |
| 6,853,836 B2 * | 2/2005 | Asam et al. ............... 455/126 |
| 6,900,778 B1 | 5/2005 | Yamamoto |
| 6,914,943 B2 | 7/2005 | Shimizu |
| 6,975,688 B2 | 12/2005 | Rexberg et al. |
| 7,010,276 B2 | 3/2006 | Sander et al. |
| 7,012,969 B2 | 3/2006 | Ode et al. |
| 7,054,385 B2 | 5/2006 | Booth et al. |
| 7,084,704 B2 * | 8/2006 | Sowlati .................... 455/102 |
| 7,109,791 B1 | 9/2006 | Epperson et al. |
| 7,113,036 B2 | 9/2006 | Moffatt et al. |
| 7,145,385 B2 * | 12/2006 | Brandt et al. ............ 455/127.1 |
| 7,158,494 B2 | 1/2007 | Sander et al. |
| 7,349,490 B2 | 3/2008 | Hunton |
| 7,372,917 B2 * | 5/2008 | Jensen ....................... 375/296 |
| 7,457,586 B1 | 11/2008 | Hietala et al. |
| 2001/0033238 A1 | 10/2001 | Velazquez |
| 2002/0008578 A1 | 1/2002 | Wright et al. |
| 2002/0041210 A1 | 4/2002 | Booth et al. |
| 2002/0060606 A1 | 5/2002 | Andre |
| 2002/0093378 A1 | 7/2002 | Nielsen et al. |
| 2002/0160821 A1 | 10/2002 | Kaikati et al. |
| 2003/0012289 A1 | 1/2003 | Lindoff |
| 2003/0133518 A1 | 7/2003 | Koomullil et al. |
| 2003/0179830 A1 | 9/2003 | Eidson et al. |
| 2003/0197558 A1 | 10/2003 | Bauder et al. |
| 2003/0215025 A1 | 11/2003 | Hietala |
| 2003/0215026 A1 | 11/2003 | Hietala |
| 2003/0227342 A1 | 12/2003 | Liu |
| 2004/0072597 A1 | 4/2004 | Epperson et al. |
| 2004/0183511 A1 | 9/2004 | Dening |
| 2004/0198414 A1 | 10/2004 | Hunton |
| 2004/0208157 A1 | 10/2004 | Sander et al. |
| 2004/0266366 A1 * | 12/2004 | Robinson et al. ............... 455/91 |
| 2005/0002470 A1 | 1/2005 | Saed et al. |
| 2005/0118965 A1 * | 6/2005 | Tanabe et al. ............ 455/127.1 |
| 2005/0195919 A1 | 9/2005 | Cova |
| 2005/0227646 A1 * | 10/2005 | Yamazaki et al. ......... 455/127.3 |
| 2006/0071711 A1 | 4/2006 | Persson et al. |
| 2006/0258306 A1 * | 11/2006 | Balteanu et al. ............. 455/108 |

OTHER PUBLICATIONS

Johnson, Jackie, "Power Amplifier Design for Open Loop EDGE Large Signal Polar Modulation Systems," RFDesign, Jun. 2006, pp. 42-50.

Pinto et al., "Phase Distortion and Error Vector Magnitude for 8-PSK Systems," London Communications Symposium, Sep. 14-15, 2000, University College London, London, England.

Volder, Jack E., "The CORDIC Trigonometric Computing Technique," IRE Trans. on Elect. Computers p. 330, Sep. 1959.

\* cited by examiner

TEMPERATURE COMPENSATED BIAS FOR AM/PM IMPROVEMENT

FIELD OF THE INVENTION

The present invention relates to a mobile terminal operating according to a polar modulation scheme, and more particularly relates to a temperature-compensated bias voltage in a power amplifier operating in a polar modulation scheme.

BACKGROUND OF THE INVENTION

Many different standards and modulation schemes exist, but one of the most prevalently used in the world of mobile terminals is the Global System for Mobile Communications (GSM). One of the modulation schemes of the GSM standard is the Enhanced Data Rates for GSM Evolution (EDGE) modulation scheme. The EDGE modulation scheme contains an amplitude modulation (AM) component and a phase modulation (PM) component. Since there is an amplitude modulation component, the power amplifier of a transmitter operating according to the EDGE modulation scheme must be linear or driven according to a polar modulation scheme.

If a polar modulation scheme is used, a phase modulated signal at the desired radio frequency is provided to the input of the power amplifier and an amplitude modulation component is used to vary the supply voltage provided to the power amplifier. As a result, the power amplifier may operate in saturation and efficiency is greatly improved. Unfortunately, the amplitude modulation component that controls the supply voltage provided to the power amplifier causes unwanted phase components to be created in the output of the power amplifier due to the non-linearities of the power amplifier. This is sometimes called Amplitude Modulation to Phase Modulation (AM/PM) distortion, and it degrades the spectral purity of the system and the Error Vector Magnitude (EVM). An "AM/PM curve" describes the phase relationship between the AM component and the PM component over a range of power control voltages.

If the amplifier is used in a polar modulated application, it becomes critical to maintain consistent and repeatable amplitude and phase versus the power control voltage in the power amplifier. This is due to the accuracy in the amplitude and phase paths required to reproduce a signal that is spectrally clean enough to pass international standards. In an ideal power amplifier, the AM/PM curve is only dependent on the supply voltage set by the collector regulator and is independent of varying conditions such as battery supply voltage, input power, and temperature. However, the power amplifier often exhibits variations that are dependent on temperature.

Specifically, the base-emitter voltage drop Vbe of a GaAs Heterojunction Bipolar Transistor (HBT) will decrease by roughly 2 mV per degree Celsius. When GaAs HBTs are used in a power amplifier, if the base bias voltage Vbias is held fixed as temperature varies, the resulting shift in base-emitter voltage drop Vbe will cause a change in quiescent current, which changes the quiescent operating condition, hereinafter referred to as the "operating condition." The operating condition influences the relative level of compression of each stage in the amplifier, which in turn directly affects the shape of the AM/PM curve.

Thus, there is a need to provide the power amplifier with a temperature-compensated bias voltage VbiasTC that is independent of supply voltage and dependent upon temperature, such that as the operating temperature of the power amplifier varies, the temperature-compensated bias voltage VbiasTC is adjusted appropriately so as to maintain a consistent operating condition in the power amplifier. Such temperature compensation provides a more consistent reproduction of the phase versus control voltage profile and allows better output RF spectrum (ORFS) performance over temperature.

SUMMARY OF THE INVENTION

The present invention relates to a system and method for maintaining a consistent operating condition of a power amplifier PA across a range of operating temperatures. Specifically, the power amplifier is provided with a temperature-compensated bias voltage VbiasTC, which adjusts with temperature to compensate for the temperature dependent change of the power amplifier's base-emitter voltage drop Vbe, thus maintaining a consistent operating condition in the power amplifier regardless of operating temperature. As the operating temperature of a GaAs HBT power amplifier increases, its base-emitter voltage drop Vbe decreases; in order to maintain a consistent operating condition, the present invention provides a temperature-compensated bias voltage VbiasTC that decreases accordingly with increasing temperature. This reduction of temperature-related variations in performance creates a power amplifier that is especially suited for use in polar modulation, where the system performance is critically dependent upon the repeatability of the phase versus power curve, which in turn is a function of the amplifier's operating condition. Thus, it is critical to maintain a consistent and repeatable operating condition for each stage of the amplifier.

The input bias voltage circuit operates by creating a bandgap reference voltage Vbg that is dependent on temperature but independent of process variation or supply voltage; using a multiplier to translate the band gap reference voltage Vbg to a voltage level that is appropriate to properly bias a GaAs heterojunction bipolar transistor HBT power amplifier; and buffering the output of the multiplier to create the temperature-compensated bias voltage VbiasTC.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a system and method for maintaining a consistent operating condition of a power amplifier (PA) across a range of operating temperatures. Specifically, the power amplifier is provided with an input bias voltage that adjusts with temperature to compensate for the temperature dependent change of the power amplifier's base-emitter voltage drop Vbe. As the operating temperature of a GaAs HBT power amplifier increases, base-emitter voltage drop Vbe decreases. In order to maintain a consistent quiescent current, the present invention provides a temperature-compensated bias voltage VbiasTC that decreases accordingly, thus maintaining a consistent operating condition in the power amplifier regardless of operating temperature.

Figure 1:
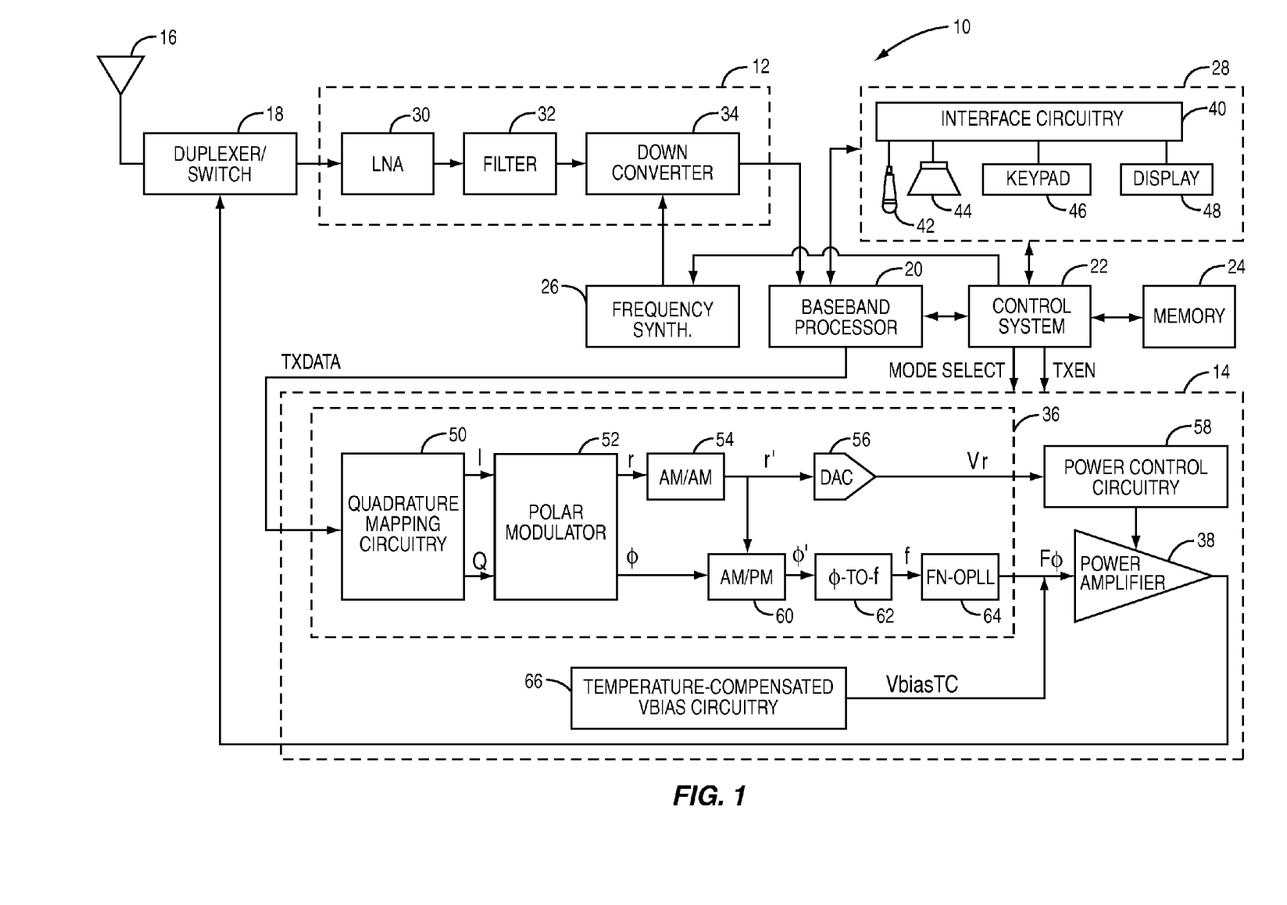
FIG. 1 illustrates an exemplary mobile terminal according to one embodiment of the present invention.

The present invention is preferably incorporated in a mobile terminal 10 such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28.

The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26. The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood in the art. After encoding the data from the control system 22, the baseband processor 20 outputs the encoded data to the radio frequency transmitter section 14. A modulator 36 receives the data from the baseband processor 20 and operates according to one or more modulation schemes to provide a modulated signal to the power amplifier circuitry 38. The modulation scheme of the modulator 36 is controlled by a mode select signal (MODE SELECT) from the control system 22.

A user may interact with the mobile terminal 10 via the interface 28, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 20. The microphone 42 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 44 by the interface circuitry 40. The keypad 46 and display 48 enable the user to interact with the mobile terminal 10, input numbers to be dialed and address book information, or the like, as well as monitor call progress information.

In one embodiment, the modulator 36 operates according to a Polar Modulation scheme, which is a modulation scheme containing both amplitude and phase components. It should be noted that Polar Modulation is an exemplary modulation scheme and is not intended to limit the scope of the present invention. A quadrature mapping module 50 receives data from the baseband processor 20, groups the data into symbols of three consecutive data bits, Grey codes, and rotates each symbol by $3\pi/8$ as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then sent to a polar modulator 52. The polar modulator 52 uses a classical coordinate rotation digital computer (CORDIC) algorithm or like rectangular-to-polar conversion technique. Thus, the polar modulator 52 generates phase ($\phi$) and amplitude (r) equivalent signals. Further information about CORDIC algorithms may be found in, "Proceedings of the 1998 ACM/SIGDA Sixth International Symposium On Field Programmable Gate Arrays," by Ray Andraka, Feb. 22-24, pp. 191-200 and, "The CORDIC Trigonometric Computing Technique," by Jack E. Volder, IRE Trans on Elect. Computers, p. 330, 1959, both of which are hereby incorporated by reference in their entireties.

The amplitude signal r is directed to AM/AM compensation circuitry 54. The AM/AM compensation circuitry 54 introduces a compensation term to the amplitude signal r from the output of the polar modulator 52 that, after further processing, counteracts the distortion introduced by AM/AM conversion, or distortion, in the power amplifier circuitry 38. Further details of an exemplary embodiment of the AM/AM compensation circuitry 54 can be found in commonly owned and assigned U.S. Patent Application Publication No. 2003/0215026, entitled AM TO AM CORRECTION SYSTEM FOR POLAR MODULATOR, filed May 16, 2002, which is hereby incorporated by reference in its entirety.

The output of the AM/AM compensation circuitry 54 is a pre-distorted amplitude signal r', which may be referred to as a digital power control signal. The pre-distorted amplitude signal r' is converted to an analog power control signal Vr by a digital-to-analog converter 56. The analog power control signal Vr is used by power control circuitry 58 to set the collector voltage on the power amplifier circuitry 38. As the amplitude signal changes, the voltage at the power amplifier circuitry 38 collector changes, and the output power will vary as V2/Rout (Rout is not shown, but is effectively the load on the power amplifier circuitry 38). This is sometimes known as "plate modulation."

The phase signal ($\phi$) from the polar modulator 52 is directed to AM/PM compensation circuitry 60, which introduces a compensation term to the phase signal (f) based on the pre-distorted amplitude signal r' from the AM/AM compensation circuitry 54. The output of the AM/PM compensation circuitry 60 is a pre-distorted phase signal (f'). The AM/PM compensation circuitry 60 counteracts the distortion introduced by AM/PM conversion, or distortion, in the power amplifier circuitry 38.

The output of the AM/PM compensation circuitry 60 is directed to a phase-to-frequency converter 62. The phase-to-frequency converter 62 generates an output at the desired radio frequency. In one embodiment, the modulator 36 receives digital transmit data (TXDATA) from the baseband processor 20, and the entire phase path from the baseband processor 20 to the phase-to-frequency converter 62 is a digital path. The output of the phase-to-frequency converter 62 is a frequency signal (f), which generally corresponds to the desired frequency deviation of the modulated signal.

The output of the phase-to-frequency converter 62 is directed to a fractional-N offset phase locked loop FN OPLL 64. Details of the FN OPLL 64 can be found in commonly owned and assigned U.S. patent application Ser. No. 11/047,258, entitled FRACTIONAL-N OFFSET PHASE LOCKED LOOP, filed Jan. 31, 2005, which is hereby incorporated by reference in its entirety. The output of the phase-to-frequency converter 62 is provided to the FN OPLL 64 to provide direct digital modulation in a manner similar to that described in commonly owned and assigned U.S. Pat. No. 6,834,084, entitled DIRECT DIGITAL POLAR MODULATOR, issued Dec. 21, 2004, which is hereby incorporated by reference in its entirety. The FN OPLL 64 generates a phase modulated signal Ff output at the desired radio frequency. In one embodiment, the entire phase path from the baseband processor 20 to the FN OPLL 64 is a digital path.

The modulator 36 provides the phase modulated signal Ff to the power amplifier circuitry 38 and an analog power control signal Vr to the power control circuitry 58, where the power control circuitry 58 controls the output power of the power amplifier circuitry 38 based on the amplitude modulating signal. The power amplifier circuitry 38 amplifies the modulated analog power control signal Vr from the modulator 36 to a level appropriate for transmission from the antenna 16. A gain of the power amplifier circuitry 38 is controlled by the power control circuitry 58. In essence, the power control circuitry 58 operates to control a supply voltage provided to the power amplifier circuitry 38. The power control circuitry 58 controls the supply voltage based on the amplitude modulation component or, optionally, a combination of the amplitude modulation component and a ramping signal from the modulator 36.

A temperature-compensated Vbias circuitry 66 provides a temperature-compensated bias voltage VbiasTC to the input of the power amplifier circuitry 38. The temperature-compensated bias voltage VbiasTC controls the quiescent operating condition of the power amplifier circuitry 38. The quiescent operating condition influences the relative level of compression of the power amplifier circuitry 38, which influences the phase error between the input of the power amplifier circuitry 38 and an output of the power amplifier circuitry 38.

Figure 2:
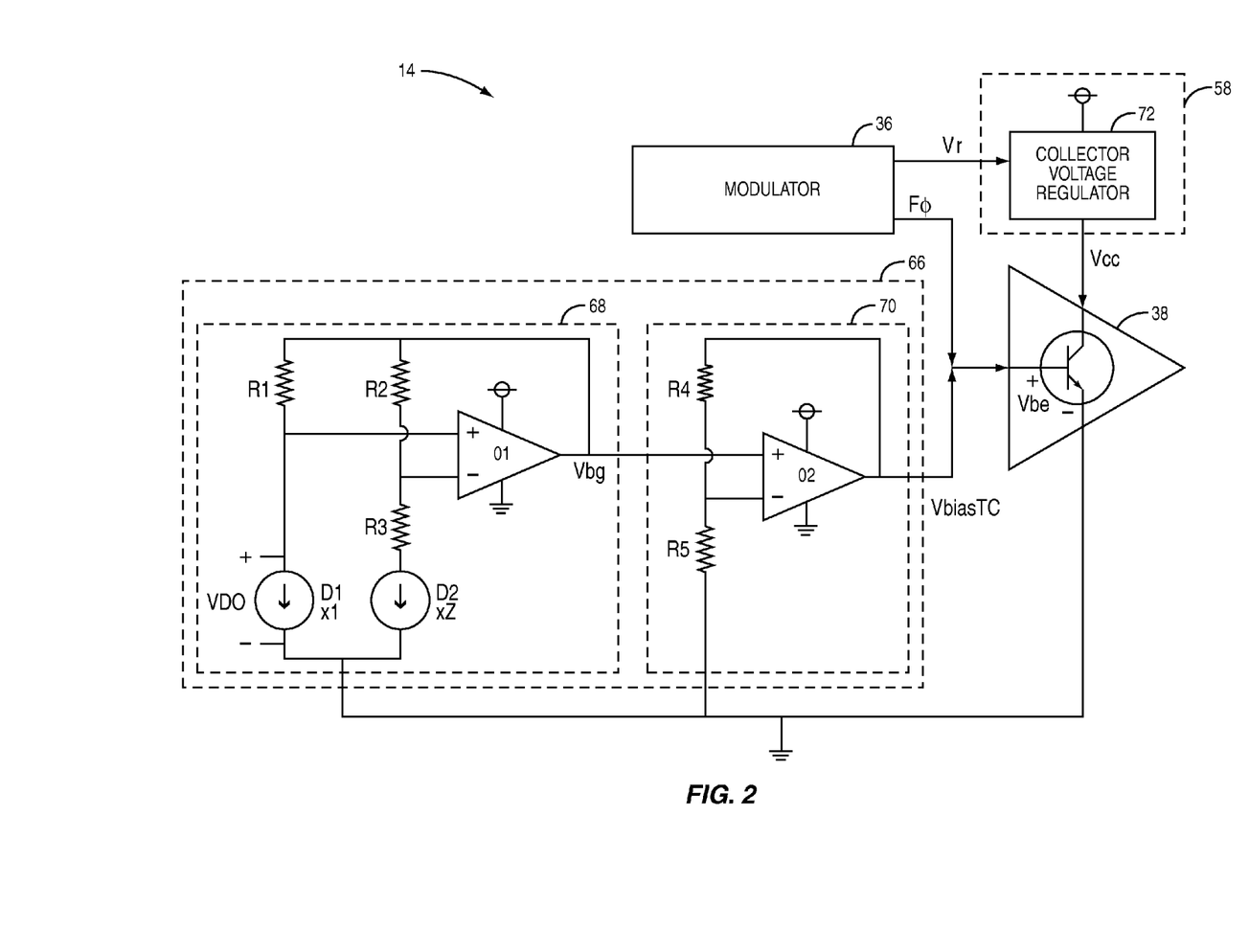
FIG. 2 illustrates the temperature-compensated Vbias circuitry of FIG. 1 according to one embodiment of the present invention.

FIG. 2 illustrates an exemplary embodiment of the temperature-compensated Vbias circuitry 66, which includes a band gap voltage reference 68 and a buffer amplifier 70. In one embodiment, the band gap voltage reference 68 includes resistors R1, R2, and R3, diodes D1 and D2, and an op-amp O1. The junction area of diode D2 is 8 times larger than the junction area of diode D1. Each diode D1 and D2 may be true a diode or alternatively, as in this exemplary embodiment, a "diode-connected" bipolar junction transistor (i.e. the transistor's base and collector are electrically shorted together), in which case the diode drop Vdo is actually the base-emitter voltage drop Vbe of the bipolar junction transistor. In operation, the band gap voltage reference 68 generates a band gap reference voltage Vbg according to the following formula:

$$Vbg = Vbe + Vt*(R2/R3)*\ln((R1*Is1)/(R2*Is2)),\qquad \text{Eq. 1}$$

where Vbg is the voltage produced at the output terminal of the op-amp O1; Vbe is the base-emitter voltage drop of the diode-connected bipolar junction transistor; Vt is the thermal voltage, whose value is equal to Boltzmann's constant (k) multiplied by the temperature in Kelvin (T) and divided by the charge of an electron (q); Is1 is the current through diode-connected BJT D1; and Is2 is the current through diode-connected BJT D2. The current through a diode is proportional to its junction size; the current through a diode-connected BJT is proportional to its emitter area. By rearranging factors for clarity, and defining coefficient α to be $$\alpha = (R2/R3)*\ln((R1/R2)*(Is1/Is2)),\qquad \text{Eq. 2}$$

the equation for Vbg becomes simply:

$$Vbg = Vbe + Vt*\alpha.\qquad \text{Eq. 3}$$

Both Vbe and Vt are temperature dependent; Vbe drops 2 mV/deg, while Vt increases 8.61E-5V/deg. By setting a proper multiplier α to balance the negative slope component Vbe against the positive slope component Vt, Vbg will have the desired temperature-dependent slope. Coefficient α is a function of several ratios: the ratio of resistors R2 and R3; the ratio of resistors R1 and R2; and the ratio of currents Is1 and Is2, which is proportional to the ratio of emitter areas of the diode-connected BJTs D1 and D2. Thus, by carefully selecting the values of R1, R2, and R3, and the emitter areas of D1 and D2, the desired multiplier α will be produced. In an exemplary embodiment of the band gap reference voltage Vbg circuit, R1/R2=1, Is1/Is2=8, and R2/R3=6.8; therefore, α=14.14.

Figure 3:
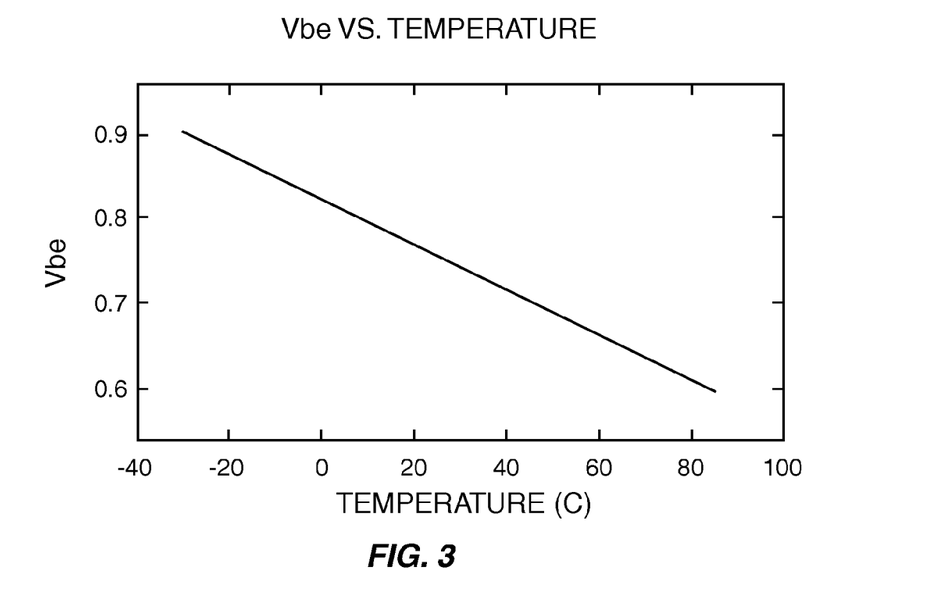
FIG. 3 is a graphical illustration showing the change of base-emitter voltage drop Vbe of a power amplifier across a range of operating temperatures according to one embodiment of the present invention.

The band gap reference voltage Vbg that is output by the band gap voltage reference 68 is provided to the buffer amplifier 70. In one embodiment, the buffer amplifier 70 includes resistors R4 and R5, and an op amp O2. In operation, the buffer amplifier 70 multiplies the input band gap reference voltage Vbg to produce the temperature-compensated bias voltage VbiasTC according to the following formula:

$$VbiasTC = Vbg*(R4/R5),\qquad \text{Eq. 4}$$

where R4 and R5 are the resistance values of resistors 4 and 5 in Ohms. The temperature-compensated bias voltage VbiasTC is a temperature-dependent voltage that decreases with increasing operating temperature to compensate for the temperature-dependent decrease in the value of base-emitter voltage drop Vbe. FIG. 2 also illustrates how the analog power control signal Vr is a control input into a collector voltage regulator 72, which outputs the collector voltage Vcc. FIG. 3 is a graph showing the change in base-emitter voltage drop Vbe with operating temperature T. For a typical GaAs power amplifier, as T increases, base-emitter voltage drop Vbe decreases. As base-emitter voltage drop Vbe decreases, the required "turn-on" component of input bias voltage Vbias is correspondingly reduced. If the total input bias voltage Vbias is not correspondingly lowered, the "headroom" component of input bias voltage Vbias is effectively increased, which results in a shift in the operating condition of the power amplifier stage. This causes a change in the relative compression level of the power amplifier stage.

Figure 4:
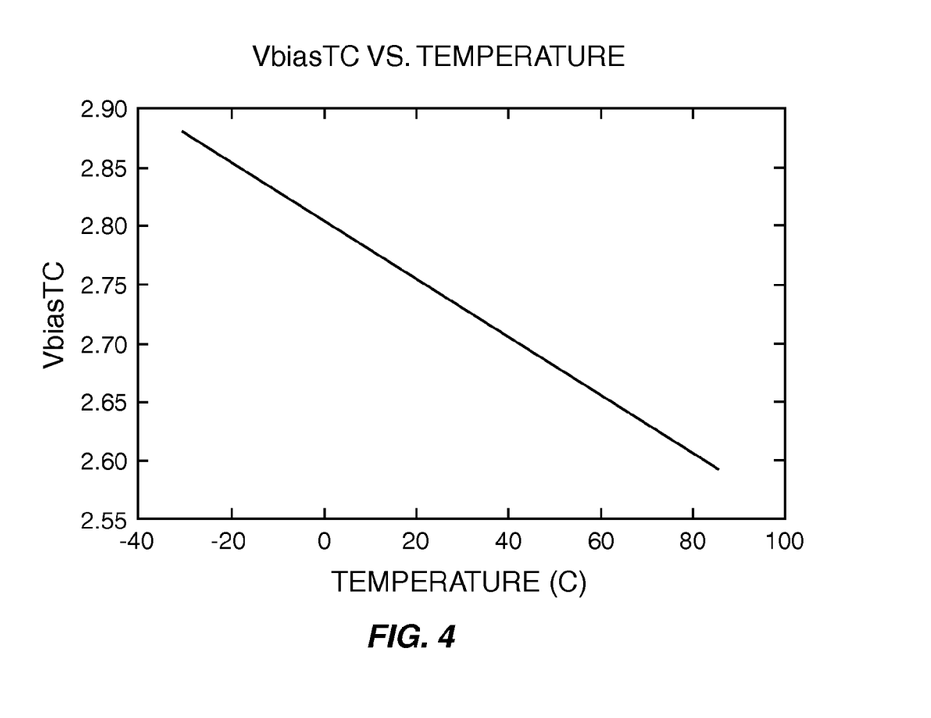
FIG. 4 is a graphical illustration showing the change of temperature-compensated bias voltage VbiasTC that is output by the temperature-compensated Vbias circuitry across a range of operating temperatures, according to one embodiment of the present invention.

FIG. 4 is a graph illustrating the temperature-compensated bias voltage VbiasTC output by the temperature-compensated Vbias circuitry 66 versus Temperature. As shown, temperature-compensated bias voltage VbiasTC decreases proportionally with increasing temperature, thus providing a input bias voltage that compensates for the reduction of the "turn on" component due to the decrease of base-emitter voltage drop Vbe with increasing temperature.

Figure 5:
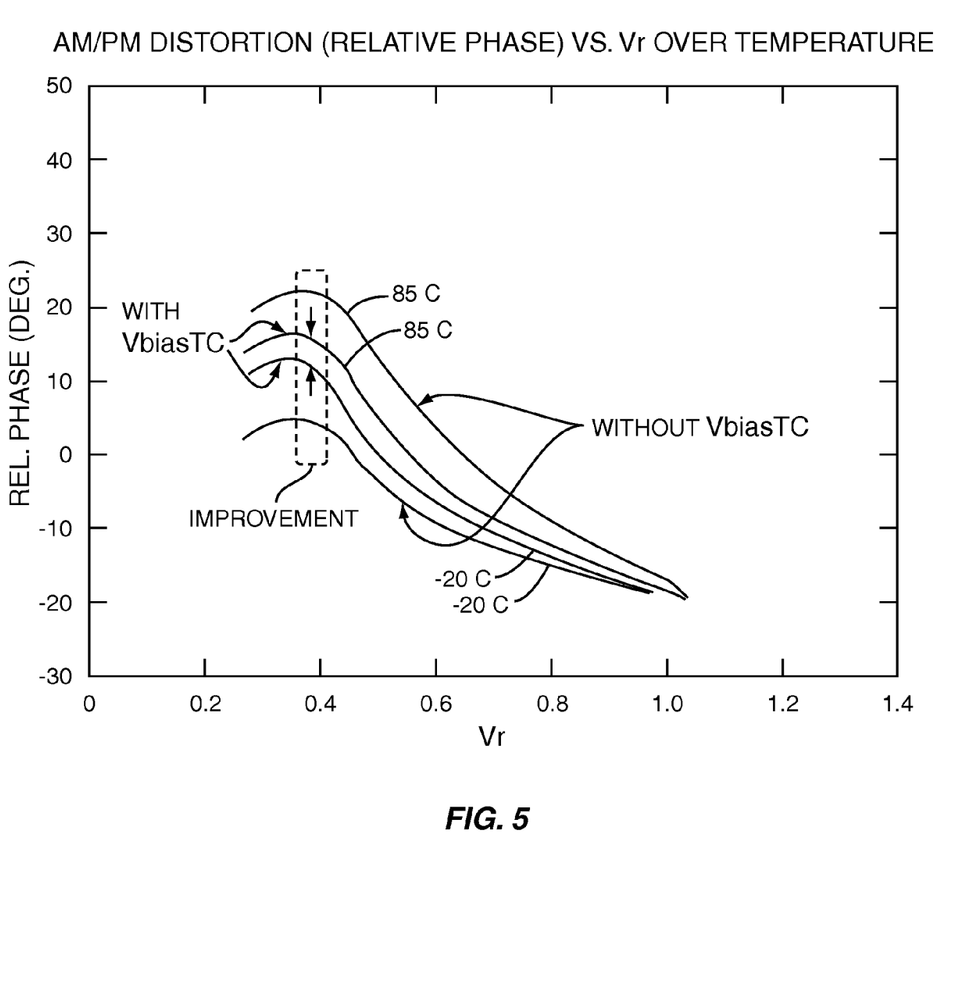
FIG. 5 is a graphical illustration comparing the performance of a power amplifier incorporating the present invention with a power amplifier that does not incorporate the present invention.

FIG. 5 is a graph illustrating the performance improvement demonstrated by a system incorporating the present invention. The graph displays AM/PM distortion versus analog power control signal Vr, for four conditions: a system that does not include the present invention (labeled "Without VbiasTC") at −20 and +85 degrees Celsius; and a system incorporating the present invention (labeled "With VbiasTC") at −20 and +85 degrees Celsius. The X axis displays the analog power control signal Vr in Volts. The Y axis displays the AM/PM distortion as relative phase in degrees. It can be seen from the graph that employing the present invention reduces the temperature-dependent change in AM/PM phase delay across all values of the analog power control signal Vr, but especially so at analog power control signal Vr voltages of 0.5 Volts and below.

Those skilled in the art will recognize improvements and modifications to the preferred embodiments of the present invention. All such improvements and modifications are considered within the scope of the concepts disclosed herein and the claims that follow.

What is claimed is:

1. A polar modulation system comprising:
   a polar modulator adapted to receive data to be transmitted and to provide a phase signal and an amplitude signal of a polar modulated signal;
   a power amplifier adapted to provide an amplified polar modulated signal and comprising a transistor, which comprises:
   a base providing a base input, which is adapted to receive the phase signal;
   a collector providing a supply input, which is adapted to receive the amplitude signal; and
      an emitter, the transistor having a base-emitter voltage drop that is dependent on the operating temperature of the power amplifier; and
      bias circuitry adapted to provide a bias signal, which is a function of an operating temperature of the power amplifier, to the base input,
      wherein the bias signal compensates for the base-emitter voltage drop as the operating temperature of the power amplifier changes and varies with the operating temperature of the power amplifier to maintain a consistent operating point as the operating temperature of the power amplifier changes.

2. The polar modulation system of claim 1 wherein the base-emitter voltage drop and a bias signal voltage drop are proportional to the operating temperature of the power amplifier.

3. The polar modulation system of claim 1 wherein the transistor is a heterojunction bipolar transistor.

4. The polar modulation system of claim 1 wherein the transistor is a gallium-arsenide heterojunction bipolar transistor.

5. A polar modulation system comprising:
   a polar modulator adapted to receive data to be transmitted and to provide a phase signal and an amplitude signal of a polar modulated signal;
   a power amplifier adapted to receive the phase signal at a base input and the amplitude signal at a supply input, and provide an amplified polar modulated signal;
   and bias circuitry comprising:
   a band-gap voltage generator adapted to provide a temperature-dependent voltage reference; and
   a bias voltage generator adapted to receive the temperature-dependent voltage reference and provide a bias signal, which is a function of an operating temperature of the power amplifier and has a temperature-dependent bias voltage, to the base input,
   wherein the bias signal provided to the base input of the power amplifier varies with the operating temperature of the power amplifier to maintain a consistent operating point as the operating temperature of the power amplifier changes.

6. The polar modulation system of claim 5 wherein the band-gap voltage generator comprises:
   at least one device with an electrical characteristic that is dependent upon operating temperature; and
   a circuit adapted to respond to a change of the electrical characteristic of the at least one device, and provide a temperature-dependant voltage reference to the bias voltage generator.

7. The polar modulation system of claim 5 wherein the bias voltage generator comprises:
   a buffer amplifier adapted to receive the temperature-dependent bias voltage reference and provide a bias voltage to the base input.

8. The polar modulation system of claim 5 wherein the band-gap voltage generator comprises:
   at least one device with an electrical characteristic that is dependent upon operating temperature; and
   a circuit adapted to respond to the change of electrical characteristic of the at least one device, and provide a temperature-dependant voltage reference to the bias voltage generator;
   wherein the bias voltage generator comprises a buffer amplifier adapted to receive the temperature-dependent bias voltage reference and provide a bias voltage to the base input.

9. A method for maintaining a consistent operating point across a range of operating temperatures of a transmitter operating according to a polar modulation scheme comprising providing a temperature-dependent bias voltage to a bias input of a power amplifier, varying the bias voltage to compensate for temperature dependent characteristics of the power amplifier, and varying the bias voltage to compensate for a base-emitter voltage drop of a heterojunction bipolar transistor power amplifier that is dependent upon the operating temperature of the power amplifier, wherein the bias voltage varies with an operating temperature of the power amplifier to maintain a consistent operating point of the power amplifier as the operating temperature of the power amplifier changes.

10. The method of claim 9 wherein providing the temperature-dependent bias voltage to the bias input of the power amplifier further comprises varying the bias voltage to compensate for a base-emitter voltage drop of a gallium-arsenide heterojunction bipolar transistor power amplifier that is dependent upon the operating temperature of the power amplifier.

11. The method of claim 9 wherein providing the temperature-dependent bias voltage to the bias input of the power amplifier further comprises:
   detecting at least one electrical characteristic at least one device that is dependent upon operating temperature of; and
   transforming the at least one electrical characteristic of the at least one device into a form suitable for use as the bias input of the power amplifier.

12. The method of claim 11 wherein providing the temperature-dependent bias voltage to the bias input of the power amplifier further comprises:

detecting a temperature-dependent voltage of the at least one device;

amplifying the temperature-dependent voltage to produce an amplified temperature-dependent voltage; and providing the amplified temperature-dependent voltage into the bias input of the power amplifier.

13. The method of claim 12 further comprising buffering the amplified temperature-dependent voltage to provide a buffered amplified temperature-dependent voltage into the bias input of the power amplifier.

* * * * *